(12) United States Patent
Meng et al.

(10) Patent No.: US 10,131,539 B2
(45) Date of Patent: Nov. 20, 2018

(54) METHOD FOR FORMING MICRO-ELECTRO-MECHANICAL SYSTEM (MEMS) DEVICE STRUCTURE

(71) Applicant: Taiwan Semiconductor Manufacturing Co., Ltd., Hsinchu (TW)

(72) Inventors: Chin-Han Meng, Hsinchu (TW); Chih-Hsien Hsu, Hsinchu (TW); Chia-Chi Chung, Hsinchu (TW); Yu-Pei Chiang, Hsinchu (TW); Wen-Chih Chen, Hsinchu (TW); Chen-Huang Huang, Shuishang Township, Chiayi County (TW); Zhi-Sheng Xu, Taichung (TW); Jr-Sheng Chen, Hsinchu (TW); Kuo-Chin Liu, Ji-an Township, Hualien County (TW); Lin-Ching Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/725,752

(22) Filed: Oct. 5, 2017

(65) Prior Publication Data

US 2018/0148324 A1    May 31, 2018

Related U.S. Application Data

(60) Provisional application No. 62/427,405, filed on Nov. 29, 2016.

(51) Int. Cl.
*B81C 1/00* (2006.01)
*H01H 59/00* (2006.01)
(Continued)

(52) U.S. Cl.
CPC ........ *B81C 1/00182* (2013.01); *B81B 3/0072* (2013.01); *B81C 1/00158* (2013.01);
(Continued)

(58) Field of Classification Search
None
See application file for complete search history.

(56) References Cited

U.S. PATENT DOCUMENTS

| 2011/0057288 A1* | 3/2011 | Tan | ........................ B81B 3/0072 257/503 |
| 2016/0087550 A1* | 3/2016 | Nagata | ................. H03H 3/0072 310/309 |

(Continued)

*Primary Examiner* — Minh-Loan Tran
(74) *Attorney, Agent, or Firm* — Birch, Stewart, Kolasch & Birch, LLP

(57) ABSTRACT

A method for forming a micro-electro-mechanical system (MEMS) device structure is provided. The method includes forming a second substrate over a first substrate, and a cavity is formed between the first substrate and the second substrate. The method includes forming a hole through the second substrate using an etching process, and the hole is connected to the cavity. The etching process includes a plurality of etching cycles, and each of the etching cycles includes an etching step, and the etching step has a first stage and a second stage. The etching time of each of the etching steps during the second stage is gradually increased as the number of etching cycles is increased.

20 Claims, 19 Drawing Sheets

(51) Int. Cl.
*H01G 5/18* (2006.01)
*B81B 3/00* (2006.01)

(52) U.S. Cl.
CPC ...... *B81C 1/00476* (2013.01); *B81C 1/00523* (2013.01); *H01G 5/18* (2013.01); *H01H 59/0009* (2013.01); *B81C 2201/0159* (2013.01); *B81C 2201/0198* (2013.01)

(56) References Cited

U.S. PATENT DOCUMENTS

| 2016/0194198 | A1* | 7/2016 | Zheng | B81B 3/0072 257/418 |
|---|---|---|---|---|
| 2017/0055085 | A1* | 2/2017 | Wang | H04R 19/005 |
| 2017/0210618 | A1* | 7/2017 | Chang | B81C 1/00158 |

* cited by examiner

METHOD FOR FORMING MICRO-ELECTRO-MECHANICAL SYSTEM (MEMS) DEVICE STRUCTURE

CROSS REFERENCE TO RELATED APPLICATIONS

This Application claims the benefit of U.S. Provisional Application No. 62/427,405, filed on Nov. 29, 2016, and entitled "Method for forming micro-electro-mechanical system (MEMS) device structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

Micro-electro mechanical system (MEMS) devices have recently been developed. MEMS devices include devices fabricated using semiconductor technology to form mechanical and electrical features. Examples of the MEMS devices include gears, levers, valves, and hinges. The MEMS devices are implemented in accelerometers, pressure sensors, microphones, actuators, mirrors, heaters, and/or printer nozzles.

Although existing devices and methods for forming the MEMS devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
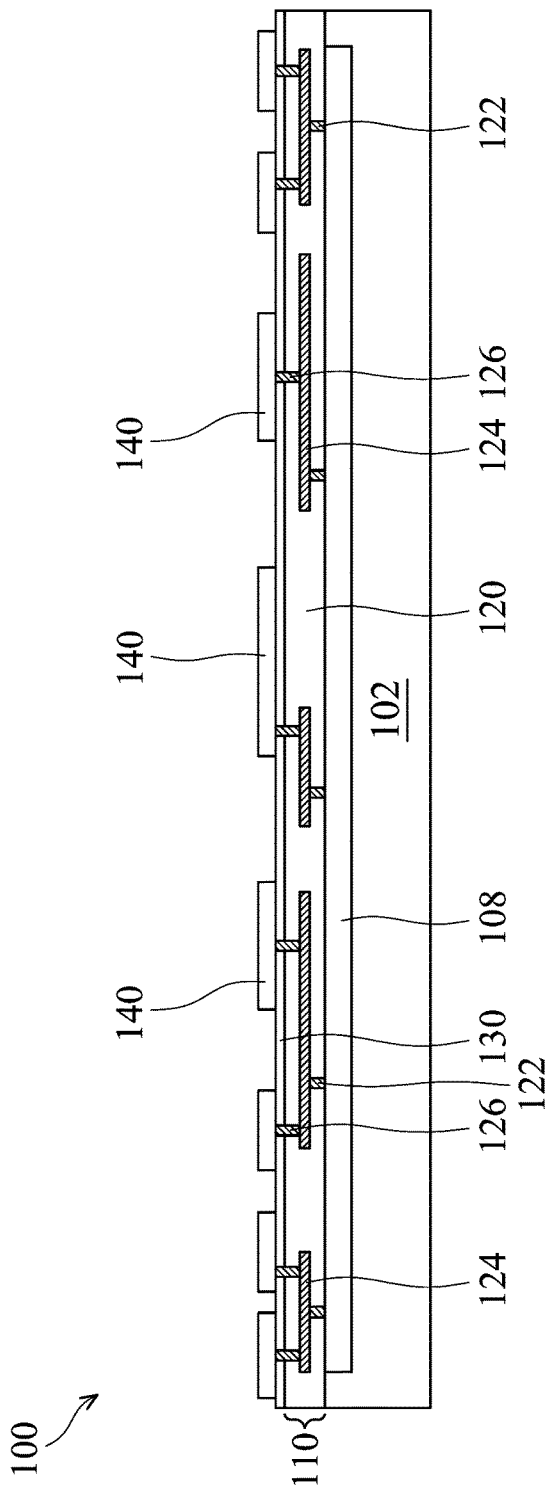
FIGS. 1A-1Q show cross-sectional representations of various stages of forming a micro-electro-mechanical system (MEMS) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a micro-electro-mechanical system (MEMS) device structure are provided. FIGS. 1A-1Q show cross-sectional representations of various stages of forming a micro-electro-mechanical system (MEMS) device structure 100, in accordance with some embodiments of the disclosure.

As shown in FIG. 1A, a first substrate 102 is provided. In some embodiments, the first substrate 102 is a wafer. The first substrate 102 may be made of silicon or other semiconductor materials. In some embodiments, the first substrate 102 is a complementary metal-oxide (CMOS) semiconductor substrate or a CMOS wafer. Alternatively or additionally, the first substrate 102 may include other elementary semiconductor materials such as germanium. In some embodiments, the first substrate 102 is made of a compound semiconductor such as silicon carbide, gallium arsenic, indium arsenide, or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer.

The first substrate 102 includes a device region 108. Some device elements are formed in the device region 108. The device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other applicable elements. Various processes are performed to form the device elements, such as deposition, etching, implantation, photolithography, annealing, and/or other applicable processes. In some embodiments, the device elements are formed in the first substrate 102 in a front-end-of-line (FEOL) process.

The first substrate 102 may include various doped regions such as p-type wells or n-type wells). The doped regions may be doped with p-type dopants, such as boron or $BF_2$, and/or n-type dopants, such as phosphorus (P) or arsenic (As). The doped regions may be formed directly on the first substrate 102, in a P-well structure, in an N-well structure or in a dual-well structure.

The isolation features (not shown), such as shallow trench isolation (STI) features or local oxidation of silicon (LO- COS) features may be formed in the device region 108. The isolation features may define and isolate various the device elements.

As shown in FIG. 1A, an interconnect structure 110 is formed on the device region 108. The interconnect structure 110 includes multiple conductive features formed in a first dielectric layer 120 (such as inter-metal dielectric, IMD). The first dielectric layer 120 includes a single layer or multiple dielectric layers. The first dielectric layer 120 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the first dielectric layer 120 is formed by a chemical vapor deposition (CVD) process, a spin-on process, a sputtering process, or a combination thereof.

In some embodiments, the first dielectric layer 120 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a first conductive via 122, a conductive line 124 and a second conductive via 126. The first conductive via 122 is electrically connected to the conductive line 124, and the conductive line 124 is electrically connected to the second conductive via 126. In some embodiments, the conductive features is made of metal materials, such as copper (Cu), aluminum (Al), titanium (Ti), tantalum (Ta), nickel (Ni), silver (Ag), gold (Au), indium (In), tin (Sn) or a combination thereof. In some embodiments, the conductive features are formed by electroplating, electroless plating, sputtering, chemical vapor deposition (CVD) or another applicable process.

An outgassing prevention layer 130 is formed on the interconnect structure 110. The outgassing prevention layer 130 prevents gases (e.g., oxygen, carbon dioxide, other gases, and/or any combinations thereof) from outgassing from the interconnect structure 110. The outgassing prevention layer 130 includes one or more layers. In some embodiments, the outgassing prevention layer 130 is made of silicon nitride, silicon oxynitride, silicon carbide, silicon oxycarbide, silicon carbon nitride or a combination thereof.

A number of electrodes 140 are formed over the outgassing prevention layer 130. The electrodes 140 are electrically connected to the second conductive via 126. In some embodiments, the electrodes 140 are made of conductive materials, such as metal materials. The metal materials may be copper (Cu), aluminum (Al), titanium (Ti), tantalum (Ta), nickel (Ni), silver (Ag), gold (Au), indium (In), tungsten (W), tin (Sn), cobalt (Co), platinum (Pt), germanium (Ge) or a combination thereof. In some embodiments, the electrodes 140 are formed by a deposition process and a patterning process. The deposition process includes electro-plating, electroless plating, sputtering, chemical vapor deposition (CVD) or another applicable process. The patterning process includes a photolithography process and an etching process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

Figure 1B:
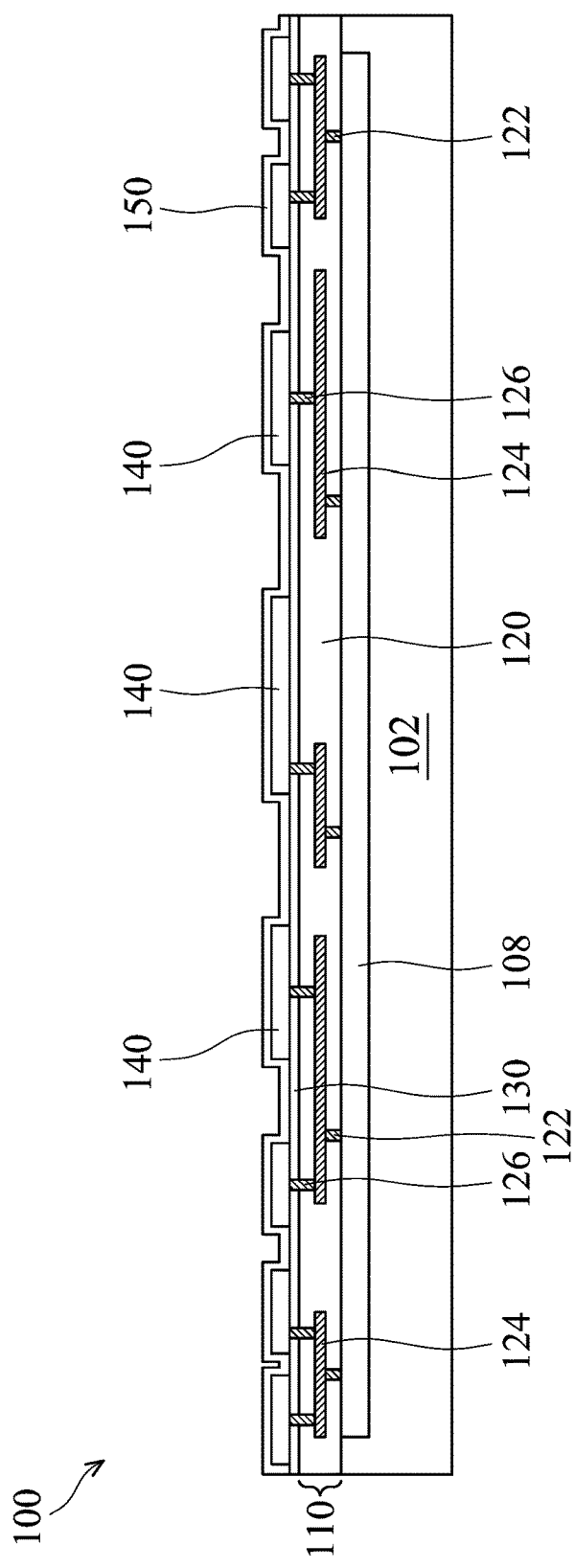

Afterwards, as shown in FIG. 1B, a gas absorption layer 150 is conformally formed over the electrodes 140 and the outgassing prevention layer 130, in accordance with some embodiments of the disclosure. The gas absorption layer 150 absorbs gases. In some embodiments, the gas absorption layer 150 is made of metal materials, such as aluminum (Al), copper (Cu), titanium (Ti), tantalum (Ta), nickel (Ni), silver (Ag), gold (Au), indium (In), tungsten (W), tin (Sn), cobalt (Co), platinum (Pt), germanium (Ge) or a combination thereof.

Figure 1C:
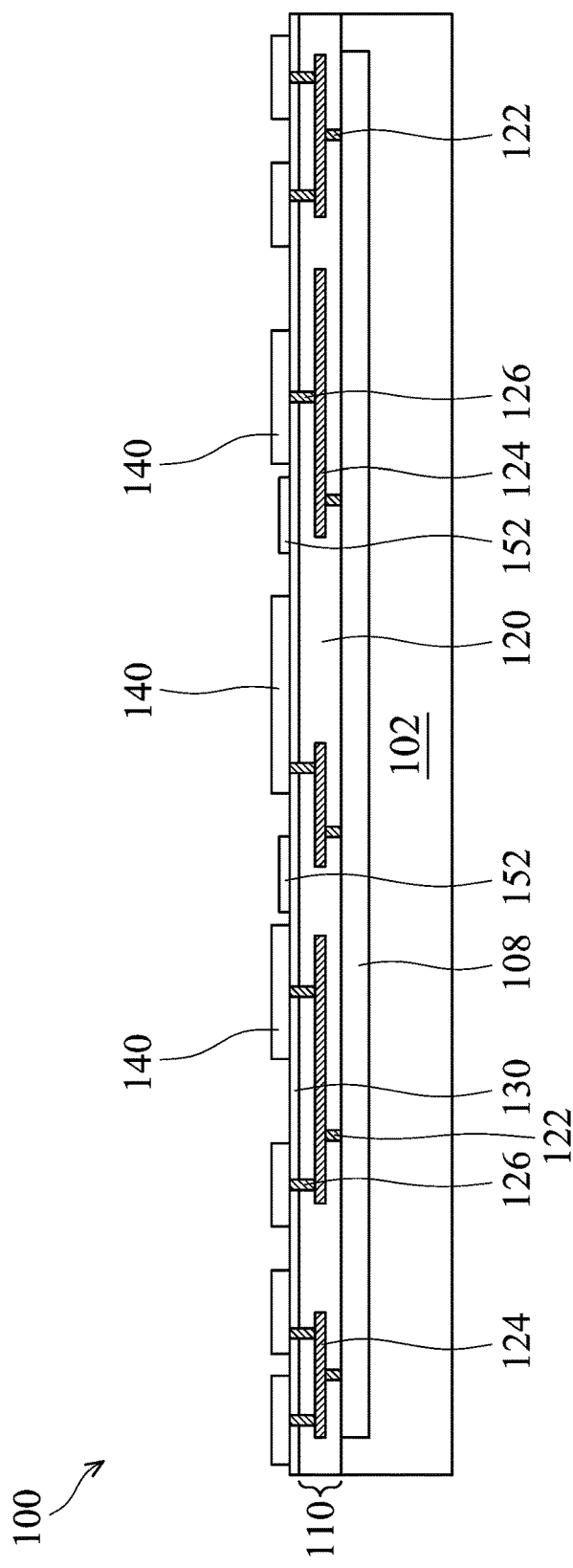

Afterwards, as shown in FIG. 1C, a portion of the gas absorption layer 150 is removed to form a gas getter structure 152, in accordance with some embodiments of the disclosure. In some embodiments, the portion of the gas absorption layer 150 is removed by a patterning process. The patterning process includes a photolithography process and an etching process. The etching process may be a dry etching process or a wet etching process.

Figure 1D:
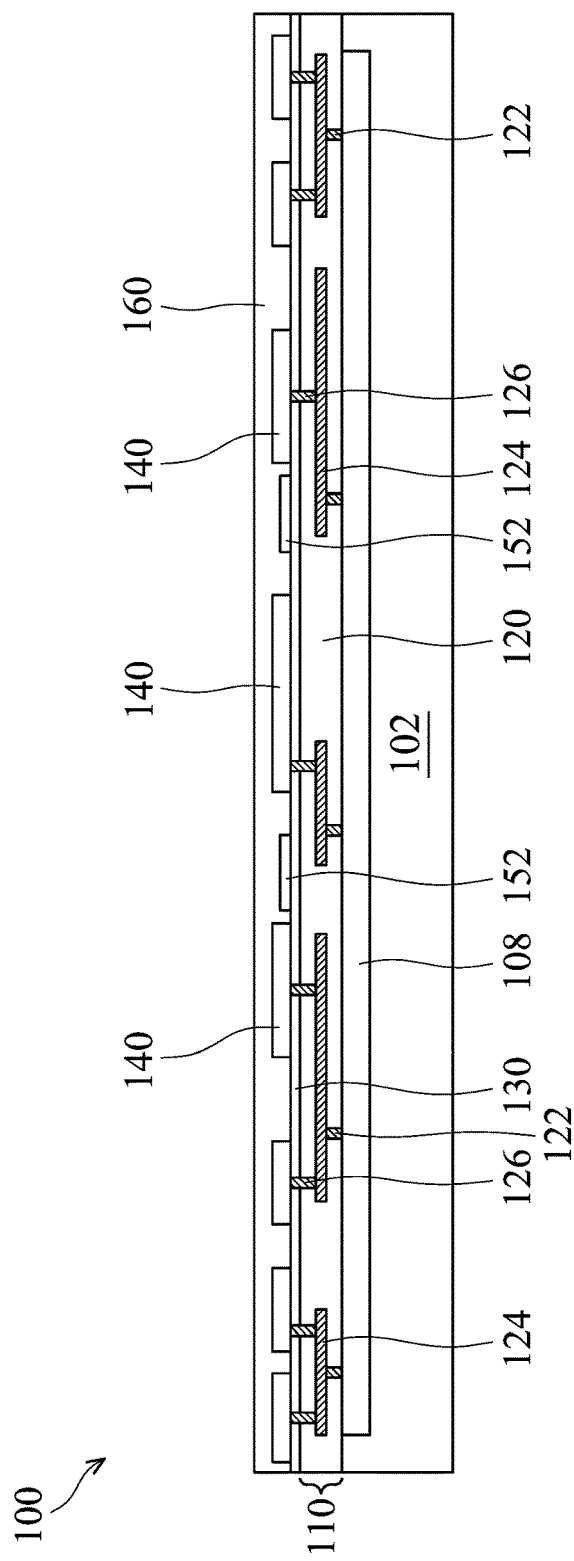

Next, as shown in FIG. 1D, a second dielectric layer 160 is formed over the outgassing prevention layer 130, the electrodes 140 and the gas getter structure 152, in accordance with some embodiments of the disclosure. The second dielectric layer 160 includes a single layer or multiple dielectric layers. In some embodiments, the second dielectric layer 160 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the second dielectric layer 160 is formed by a chemical vapor deposition (CVD) process, a spin-on process, a sputtering process, or a combination thereof.

Figure 1E:
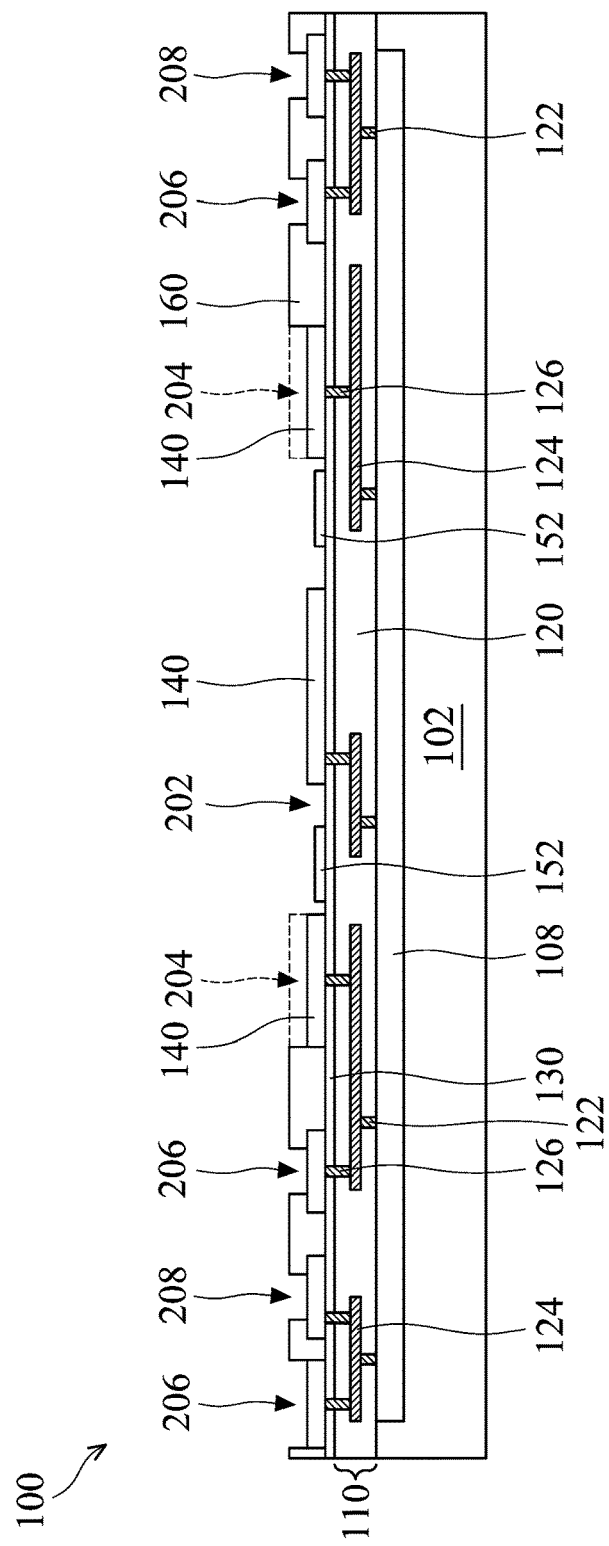

Afterwards, as shown in FIG. 1E, a portion of the second dielectric layer 160 is removed to form a cavity 202, a channel 204, a first trench 206 and a second trench 208, in accordance with some embodiments of the disclosure. In some embodiments, the portion of the second dielectric layer 160 is removed by a patterning process. The patterning process includes a photolithography process and an etching process. The etching process may be a dry etching process or a wet etching process.

The cavity 202 is formed between the electrodes 140 and gas getter structure 152, and the channel 204 is directly formed above the electrodes 140. The channel 204 is connected to the cavity 202. The channel 204 is laterally extended from the cavity 202. The first trench 206 and the second trench 208 are outside of the cavity 202.

Figure 1F:
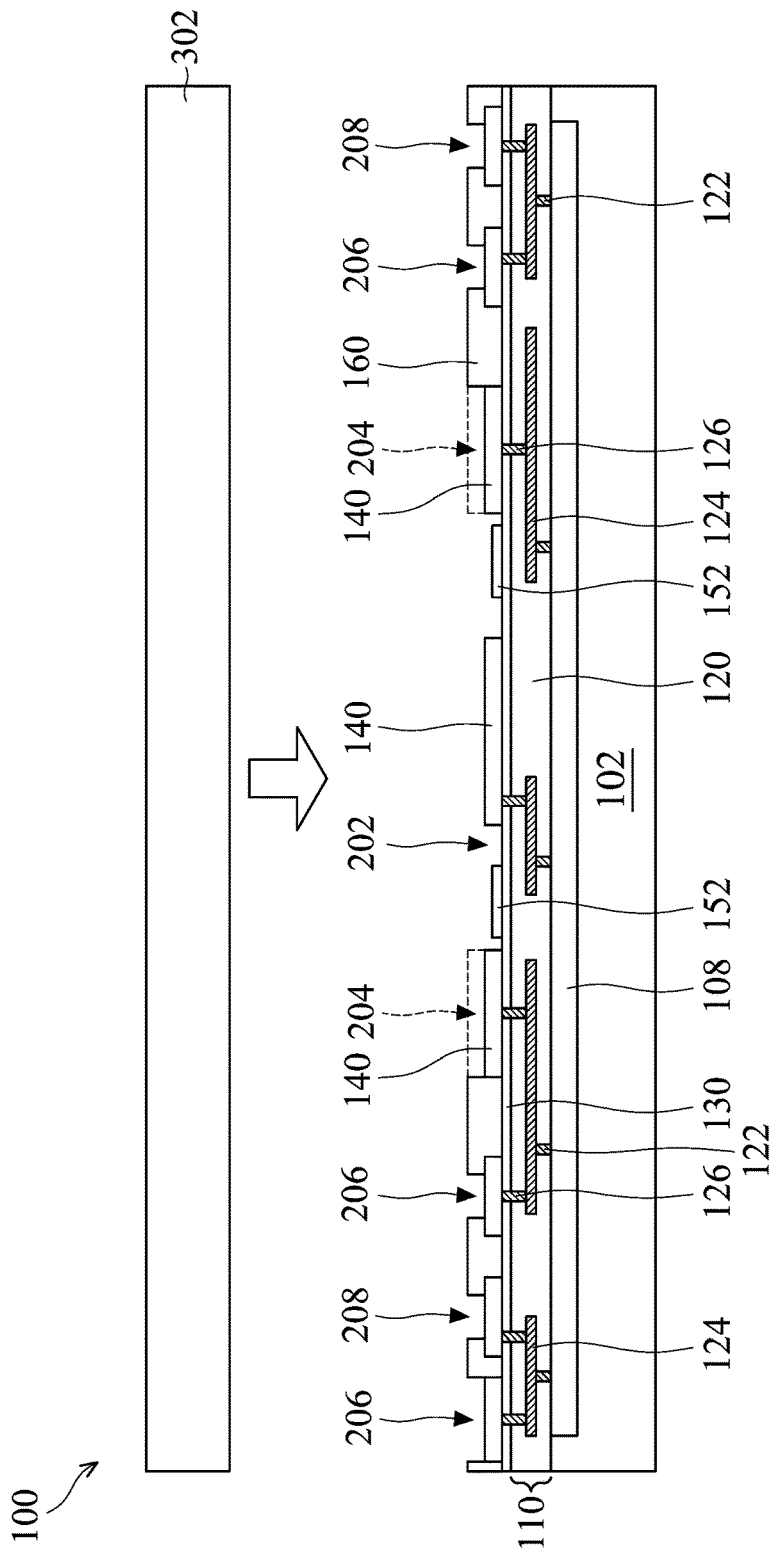

Afterwards, as shown in FIG. 1F, a second substrate 302 is above the first substrate 102, in accordance with some embodiments of the disclosure. In some embodiments, the second substrate 302 is a MEMS substrate. In some embodiments, the first substrate 102 is a CMOS wafer, and the second substrate 302 is a MEMS wafer.

The material of the second substrate 302 may be the same as the material of the first substrate 102. The second substrate 302 may be made of silicon (Si), silicon-based materials, or other semiconductor materials, such as germanium (Ge). In some embodiments, the second substrate 302 is a semiconductor substrate, such as a silicon (Si) wafer. In some embodiments, the second substrate 302 is made of a compound semiconductor such as silicon carbide, gallium arsenic, indium arsenide, or indium phosphide.

Figure 1G:
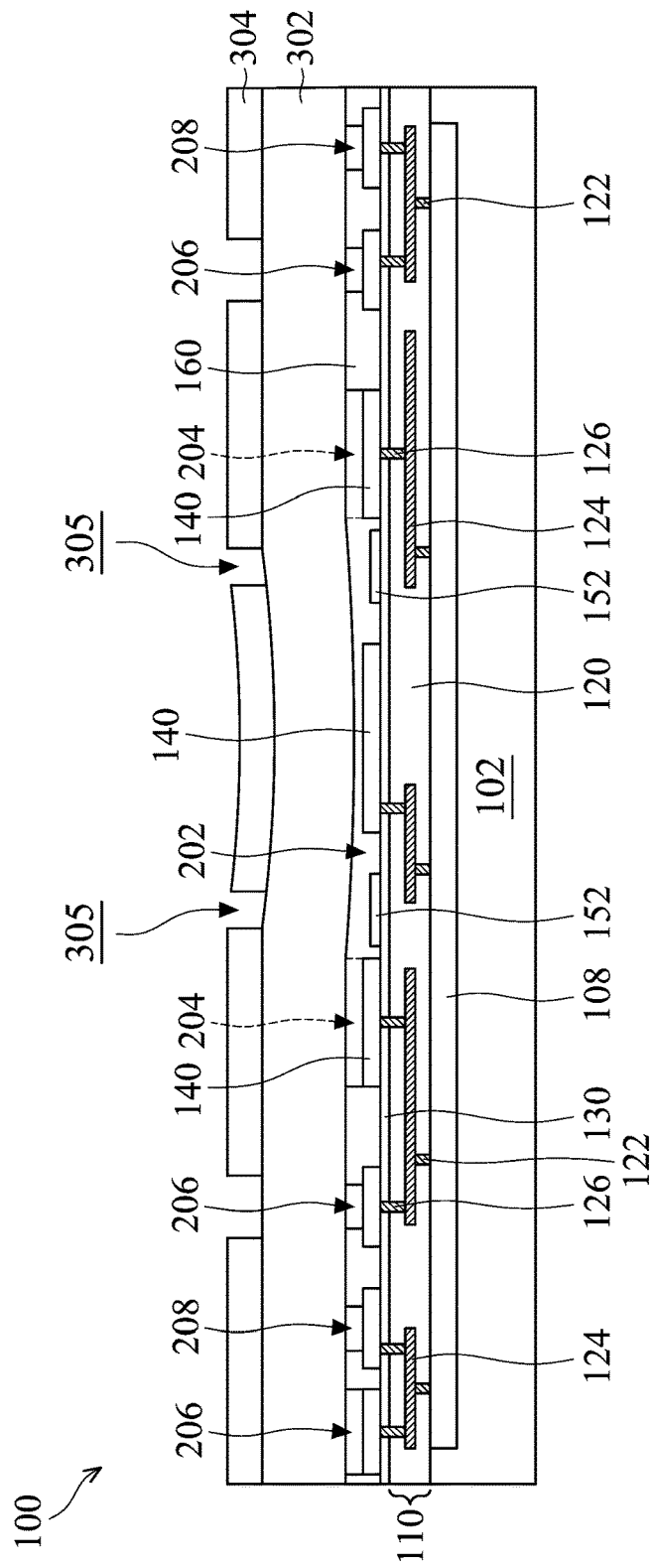

Afterwards, as shown in FIG. 1G, the second substrate 302 is bonded to the first substrate 102 by bonding the second substrate 302 and the second dielectric layer 160. In some embodiments, the second substrate 302 is bonded to the first substrate 102 by performing a fusion bonding process. As a result, the cavity 202 and the channel 204 are surrounded or enclosed by the electrodes 140 and the second substrate 302. The first trench 206 and the second trench 208 are enclosed by the second dielectric layer 160 and the second substrate 302.

Note that after the second substrate 302 is bonded to the second dielectric layer 160, the inside region, such as the channel 204, or the cavity 202 are in a vacuum condition. But, the outside of the second substrate 302 is at an ambient pressure, for example, atmospheric pressure. Therefore, the second substrate 302 is bent because the outer pressure (e.g. 1 atm) is greater than the inner pressure (e.g. close to vacuum). As shown in FIG. 1G, a portion of the second substrate 302 is bent to form a concave structure.

Afterwards, a photoresist layer 304 is formed over the second substrate 302, and the photoresist layer 304 is patterned to form a patterned photoresist layer 304, in accordance with some embodiments of the disclosure. The patterned photoresist layer 304 has a number of openings 305.

Figure 1H:
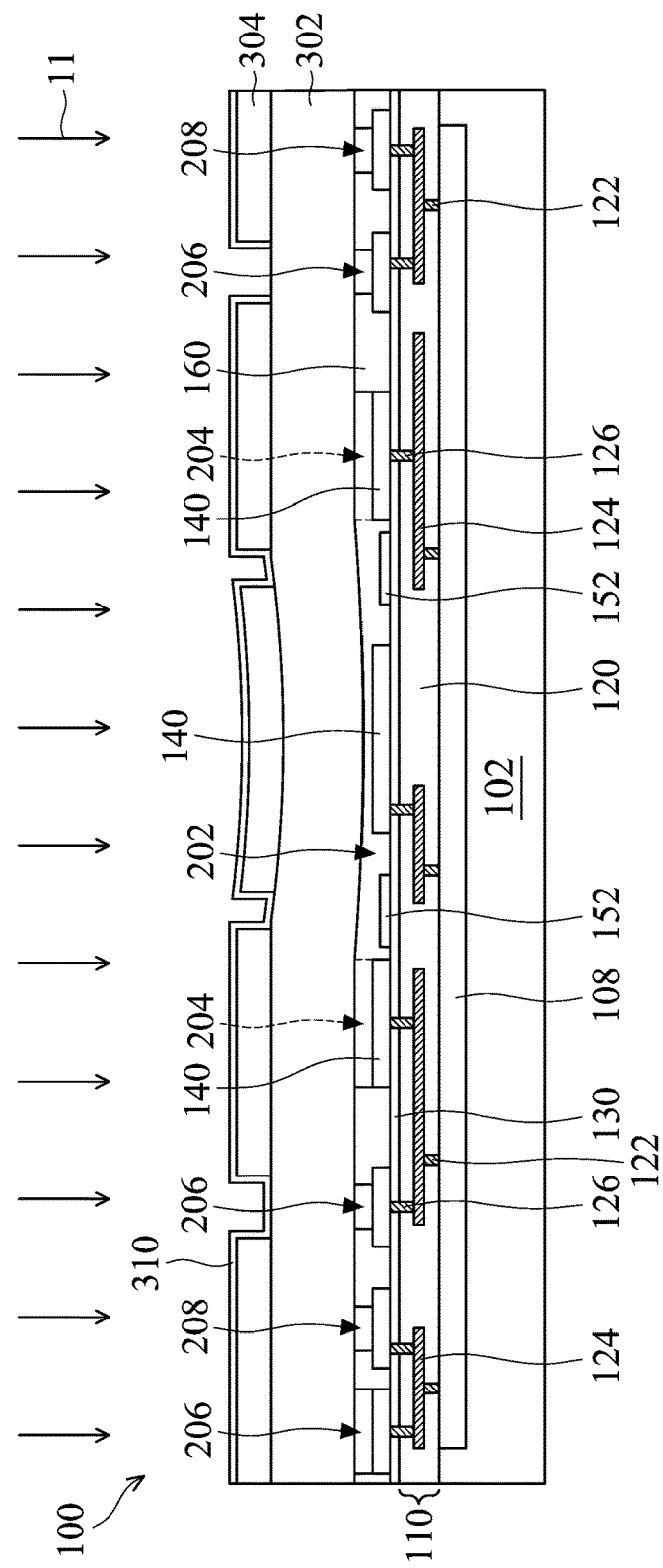
Figure 1I:
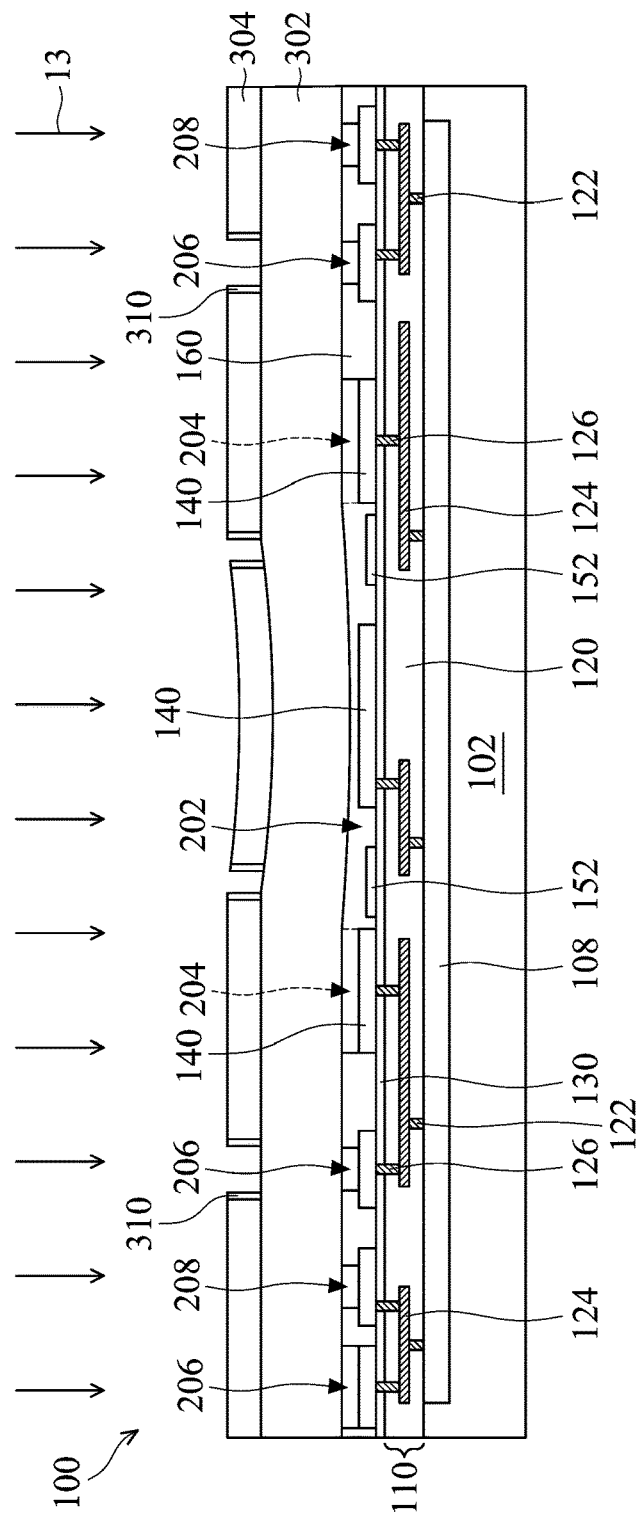
Figure 1J:
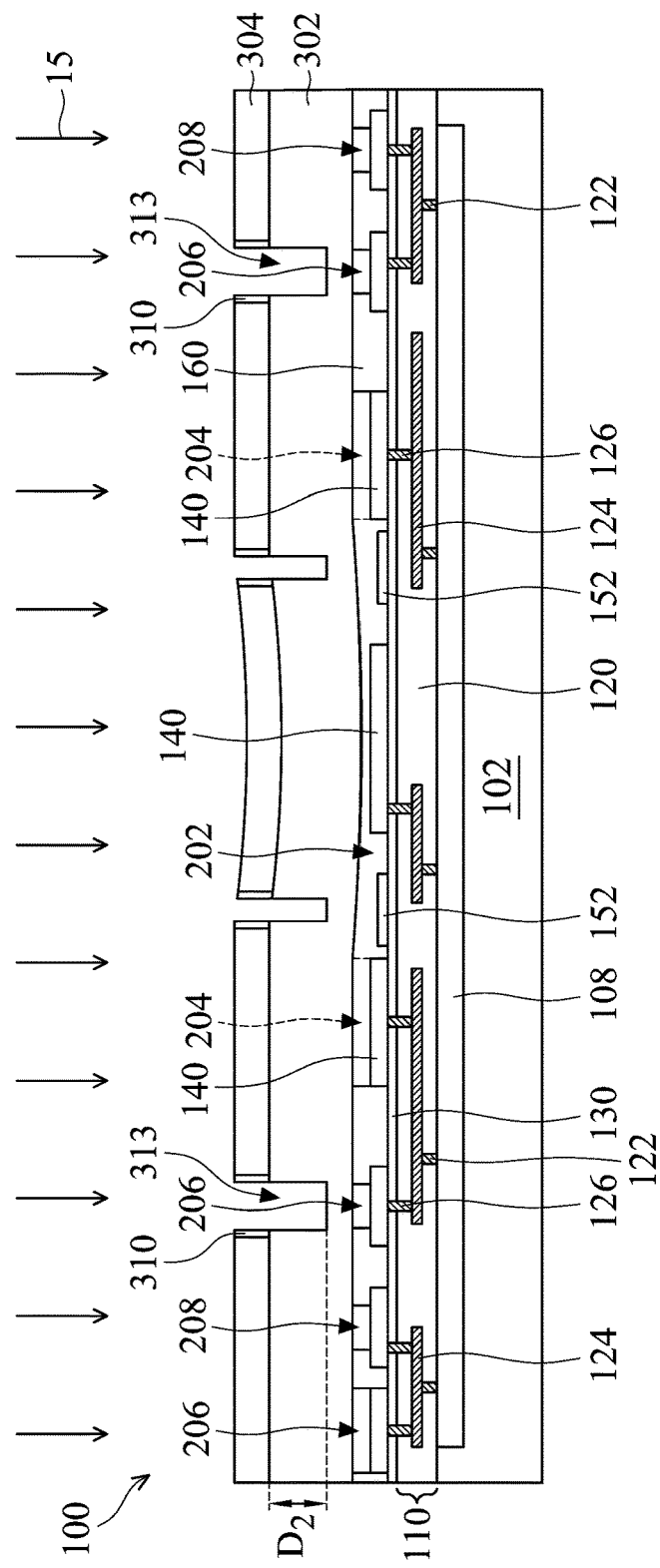
Figure 1K:
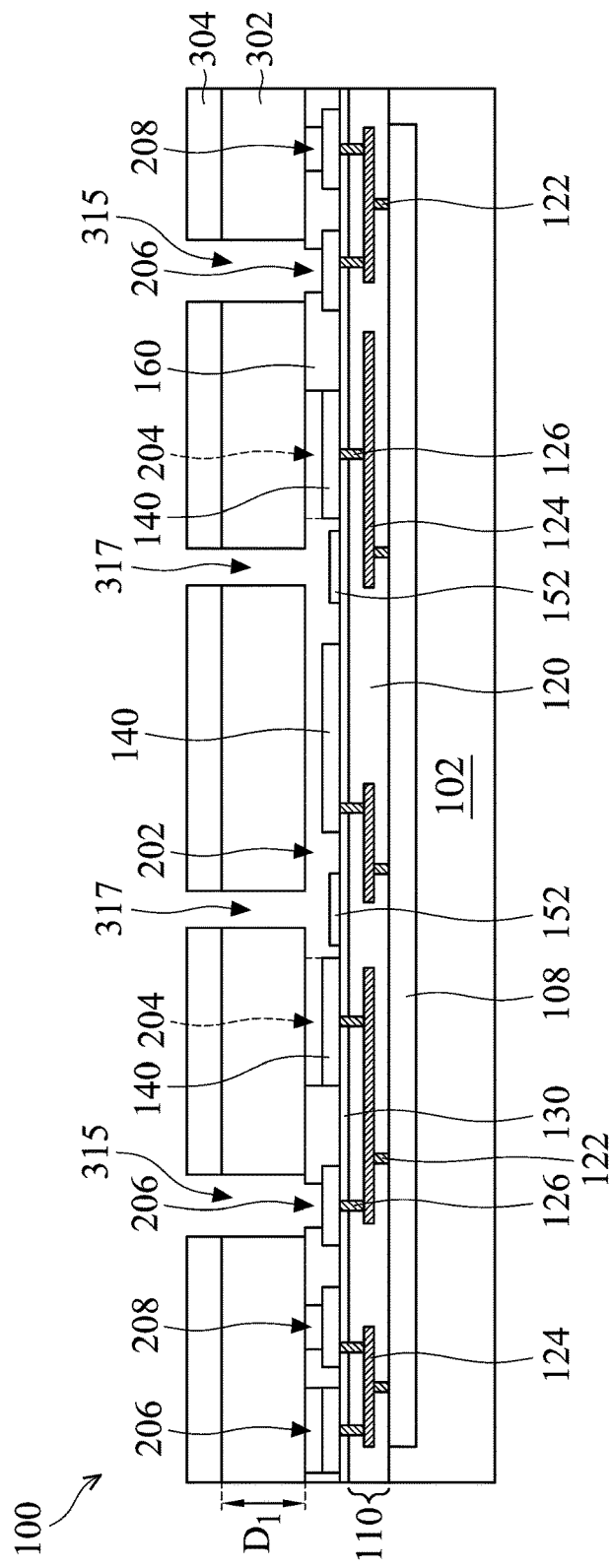

Next, an etching process is performed on the second substrate 302 to form a number of first holes 315 and the second holes 317, as shown in FIG. 1K. The etching process includes a number of etching cycles, and each of the etching cycles includes the following three steps as shown in FIGS. 1H-1J. The three steps are repeated until the first holes 315 and the second holes 317 have predetermined depth $D_1$. The predetermined depth $D_1$ is the thickness of the second substrate 302.

Afterwards, as shown in FIG. 1H, a deposition step 11 is performed to form a protection layer 310 in the openings 305 and on the patterned photoresist layer 304, in accordance with some embodiments of the disclosure. The protection layer 310 is made of fluorocarbon compound and is used to protect the sidewall of the openings 305 of the patterned photoresist layer 304.

The deposition step 11 is a plasma process. The deposition step 11 is performed using a fluorocarbon gas including octafluorocyclobutane ($C_4F_8$), tetrafluoromethane ($CF_4$), trifluoromethane ($CHF_3$), difluoromethane ($CH_2F_2$) or a combination thereof.

Next, as shown in FIG. 1I, a stripping step 13 is performed to remove a portion of the protection layer 310, in accordance with some embodiments of the disclosure. More specifically, a bottom of the protection layer 310 is removed to expose a portion of the second substrate 302. During the stripping step 13, the second substrate 302 is bent to have a concave structure because the outer pressure (e.g. 1 atm) is greater than the inner pressure (e.g. close to vacuum).

The stripping step 13 is a plasma process. The deposition step 11 is performed using a gas including sulfur hexafluoride ($SF_6$), octafluorocyclobutane ($C_4F_8$).

Afterwards, as shown in FIG. 1J, an etching step 15 is performed to remove a portion of the second substrate 302, in accordance with some embodiments of the disclosure. The etching step 15 is performed using an etching gas that may include sulfur hexafluoride ($SF_6$), octafluorocyclobutane ($C_4F_8$).

Afterwards, the processing steps of FIGS. 1H-1J may be repeated until the second substrate 302 is etched through. One etching cycle includes the step of FIGS. 1H-1J. After a number of etching cycles, the second substrate 302 is etched through to form the first hole 315 and the second hole 317.

Figure 2B:
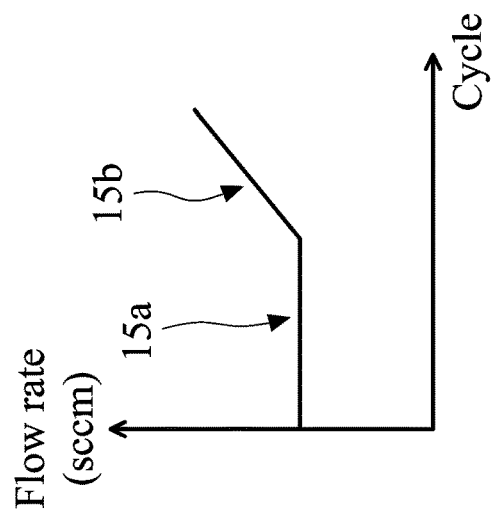
FIG. 2B shows the relationship between the flow rate of the etching gas in the etching step and the number of cycles, in accordance with some embodiments of the disclosure.
Figure 2A:
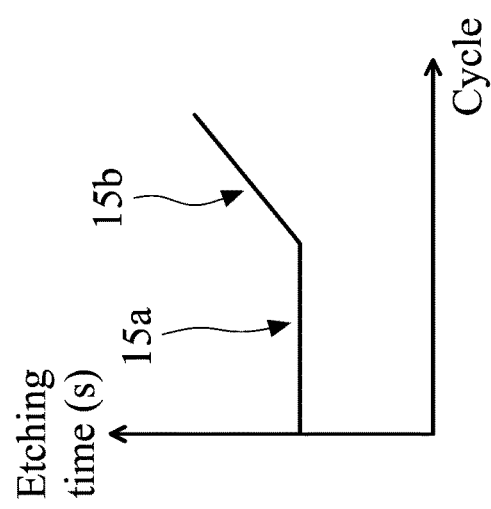
FIG. 2A shows the relationship between the etching time and the number of cycles of the etching step, in accordance with some embodiments of the disclosure.

FIG. 2A shows the relationship between the etching time and the number of cycles of the etching step 15, in accordance with some embodiments of the disclosure. The etching step 15 has two stages including a first stage 15a and a second stage 15b. In some embodiments, the first stage is a main etching stage, and the second stage is an over etching stage. It should be noted that the etching step 15 is changed from the first stage 15a to the second stage 15b when the intermediated depth $D_2$ of the first hole 315 is in a range from about 70% to about 80% of the predetermined depth $D_1$. If the range is smaller than 70%, the second stage 15b may be initiated too early, and the etching strength may be too strong to etch fast. Once the etching rate is increased too high and thus the etching depth of the second substrate 302 is difficult to control. If the range is greater than 80%, the second stage 15b may be initiated too late, and the etching strength may not be strong enough to remove all of the by-products. Therefore, some unwanted remaining polymer may be left in the first hole 315 and the second hole 317 to degrade the performance of the MEMS device structure 100.

During the first stage 15a, the etching time of each of the etching steps 15 is a constant value as the number of etching cycle is increased. During the second stage 15b, the etching time of each of etching steps 15 is gradually increased as the number of etching cycle is increased. The etching time of the second stage 15b is greater than the etching time of the first stage 15a. Therefore, more by-products, such as unwanted polymer may be removed completely by the etching step 15 in the second stage 15b.

In some embodiments, during the first stage 15a, the etching time of the etching step 15 in each etching cycle is in a range from about 2.2 seconds to 2.6 seconds. During the second stage 15b, the etching time of the etching step 15 in each etching cycle has a linear distribution, and the etching time is gradually increased as the number of etching cycle is increased. In some embodiments, the etching time of the etching step 15 in each etching cycle is in a range from about 3.8 seconds to 4.2 seconds.

In some embodiments, the etching process includes twenty etching cycles. In the first stage 15a, the etching time of the etching step 15 is a constant value, such as 2.4 seconds from the first etching cycle to fifteenth etching cycles. In the second stage 15b, the etching time of the etching step 15 is gradually increased, such as from 3.8 seconds to 4.2 seconds, from sixteenth etching cycles to twentieth etching cycles.

FIG. 2B shows the relationship between the flow rate of the etching gas in the etching step 15 and the number of cycles, in accordance with some embodiments of the disclosure. During the first stage 15a, the flow rate of the etching gas of each of the etching steps 15 is a constant value as the number of etching cycles is increased. During the second stage 15b, the flow rate of the etching gas of each of the etching steps during the second stage is gradually increased as the number of etching cycles is increased. In some embodiments, during the first stage 15a, the flow rate of the etching gas of the etching step 15 in each etching cycle is in a range from about 225 sccm to about 225 sccm. In some embodiments, during the second stage 15b, the flow rate of the etching gas of the etching step 15 in each etching cycle is in a range from about 270 sccm to about 330 sccm.

It should be noted that if some unwanted by-products are remaining in the second hole 317, the by-products may flow into the cavity 202 or the channel 204 to pollute the electrodes 140 by the subsequent fabricating processes. In addition, the second hole 317 may not be completely filled with the metal materials (formed later, shown in FIG. 1M) due to some voids may be formed in the second hole 317. By solving the by-products problems, the etching step 15 is divided into two-stage etching operations. The unwanted by-products are removed completely by the over etching operation of the second stage 15b. Therefore, the performance of the MEMS device structure 100 is improved.

Afterwards, as shown in FIG. 1K, after the etching process is completed, the first hole 315 and the second hole 317 are formed in the second substrate 302, in accordance with some embodiments of the disclosure. The opening width of the second hole 317 is smaller than the opening width of the first hole 315. The first hole 315 is connected to the cavity 202. The second hole 317 is connected to the first trench 206. When the first hole 315 is connected to the cavity 202, the ambient pressure, for example, atmospheric pressure (e.g. 1 atm) is in the first hole 315 and the cavity 202. Therefore, the bended second substrate 302 is recovered to have a planar structure.

Figure 1L:
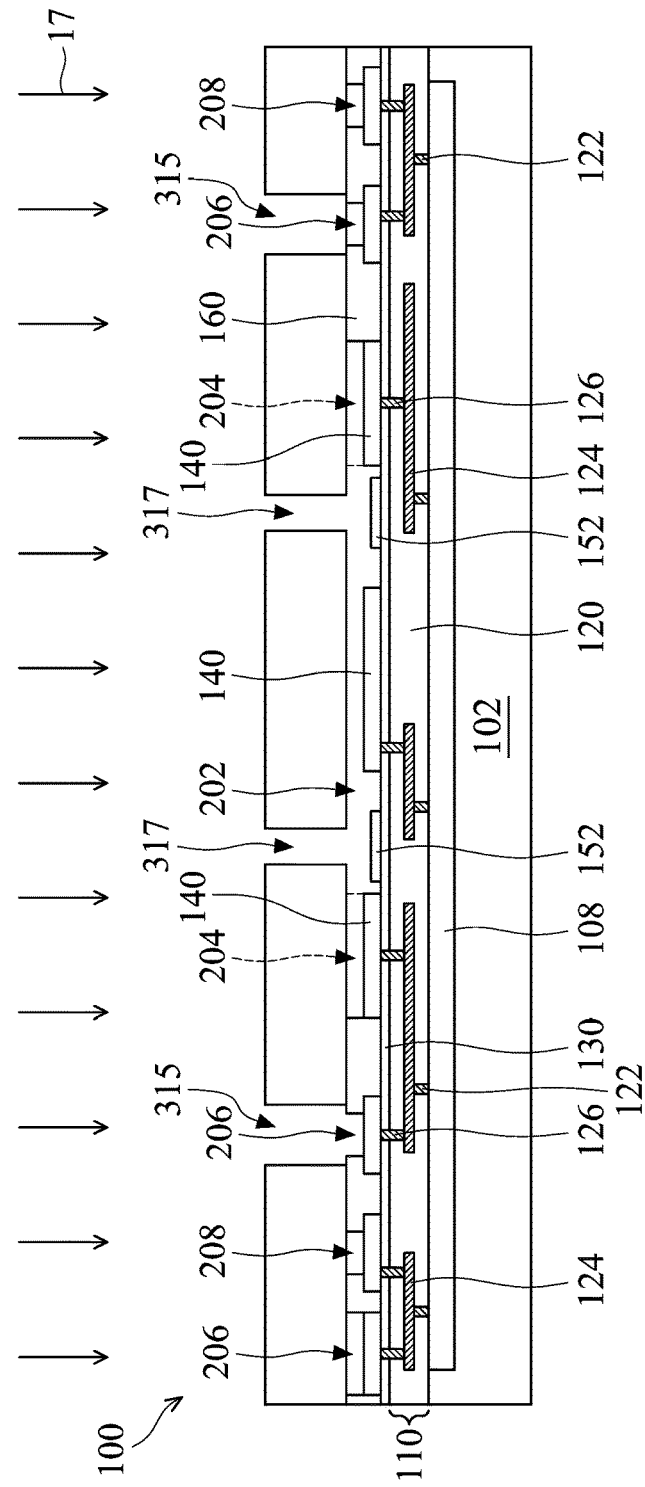

Afterwards, as shown in FIG. 1L, a cleaning process 17 is performed on the first hole 315 and the second hole 317, in accordance with some embodiments of the disclosure. The cleaning process 17 is used to remove any residual material left in the first hole 315 and/or the second hole 317. If the solvent is left in the first hole 315 and/or the second hole 317, the solvent may be heated by the subsequent processes to form vapor gas. If too much vapor gas is left in the cavity 202 and/or the channel 204, the pressure of the cavity 202 may be increased because too much vapor gas accumulates inside of the second substrate 302. Therefore, the second substrate 302 may be pushed out due to the high pressure and the risk of the peeling of the second substrate 302 is increased.

It should be noted that the cleaning process 17 is a dry plasma process and does not comprise a wet cleaning process to avoid any solvent left in the first hole 315, the second hole 317, and in the cavity 202. If the solvent flows into the cavity 202, the electrodes 140 may be damaged and the detection of the electrodes 140 may be affected. In some embodiments, the cleaning process 17 is performed using an oxygen ($O_2$) plasma.

It should be noted that the cleaning process 17 and the etching process (including the deposition step 11, stripping step 13 and etching step 15) are performed in the same chamber. In other words, the cleaning process 17 and the etching process are performed in-situ without transferring the MEMS device structure 100 to another chamber. Therefore, the pollution problems are reduced, and the fabrication time and cost are reduced.

Figure 1M:
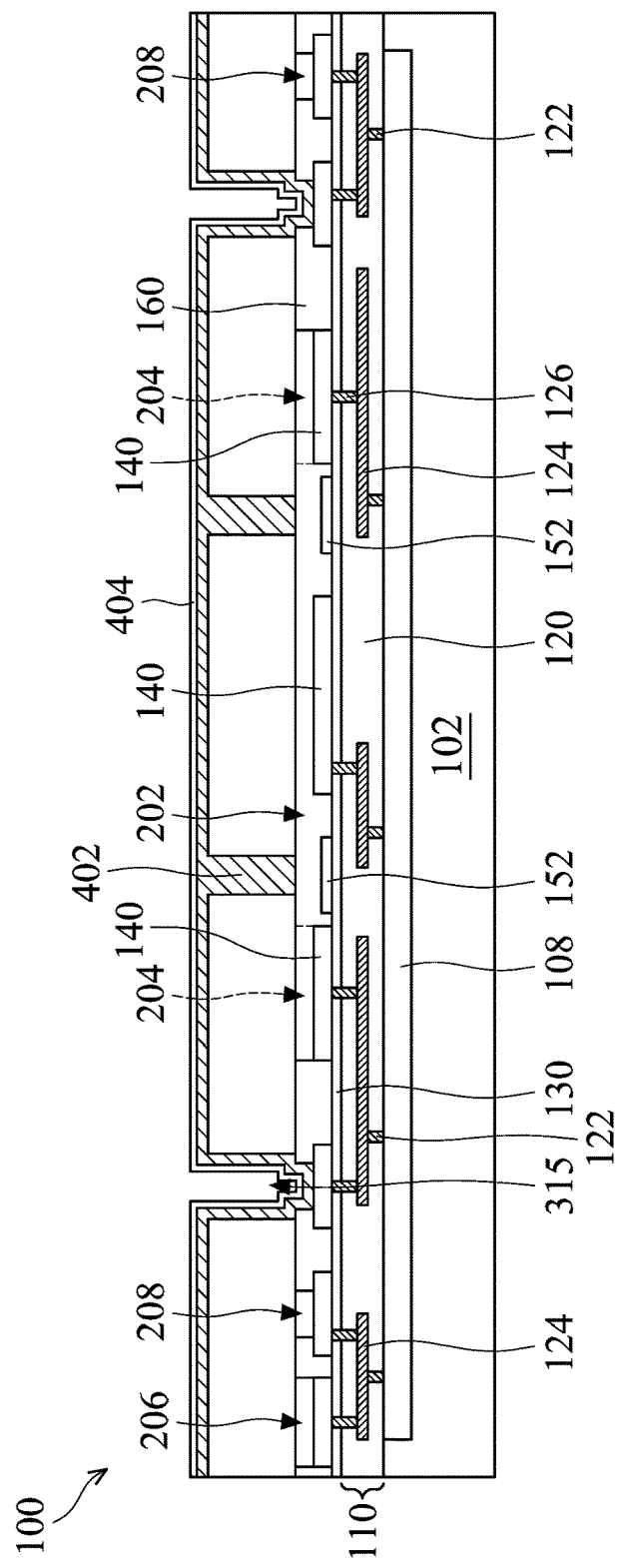

Before the step of FIG. 1M, an exhaust process is performed to exhaust air inside of the first hole 315 and the second hole 317. In other words, the air in the cavity 202 and the channel 204 are exhausted. As a result, the cavity 202 and the channel 204 are in a vacuum state. The cleaning process 17 and the exhaust process are performed in-situ without transferring the MEMS device structure 100 to another chamber. Therefore, the pollution problems are reduced, and the fabrication time and cost are reduced.

Next, as shown in FIG. 1M, a conductive layer 402 is formed in the first hole 315 and the second hole 317, and a third dielectric layer 404 is formed in the conductive layer 402, in accordance with some embodiments of the disclosure.

Figure 1N:
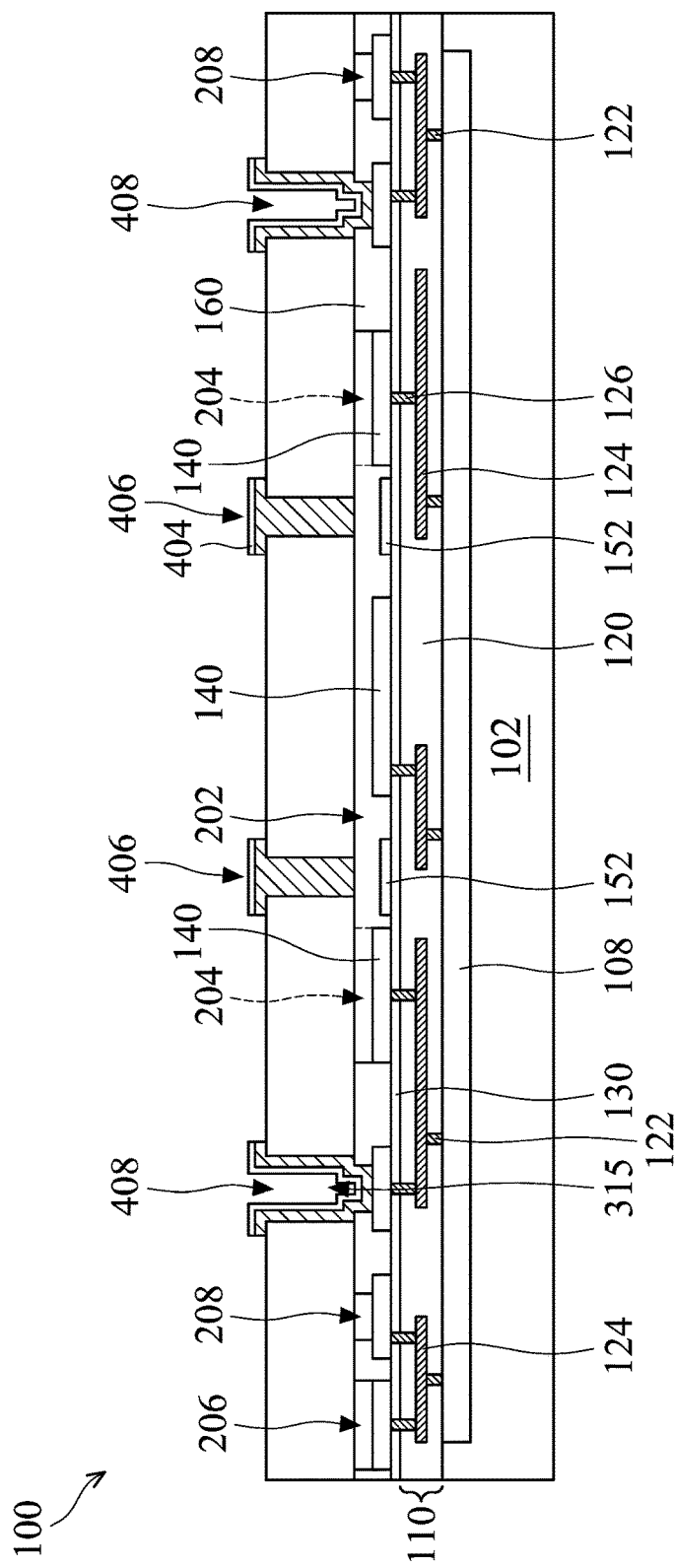

Afterwards, as shown in FIG. 1N, a portion of the conductive layer 402 and a portion of the third dielectric layer 404 are removed to form a first plug 406 and a second plug 408, in accordance with some embodiments of the disclosure. The portion of the conductive layer 402 and the portion of the third dielectric layer 404 are removed by a patterning process. The patterning process includes a photolithography process and an etching process. Examples of the photolithography process include photoresist coating (e.g., spin-on coating), soft baking, mask aligning, exposure, post-exposure baking, developing photoresist, rinsing and drying (e.g., hard baking). The etching process may be a dry etching process or a wet etching process.

Figure 3:
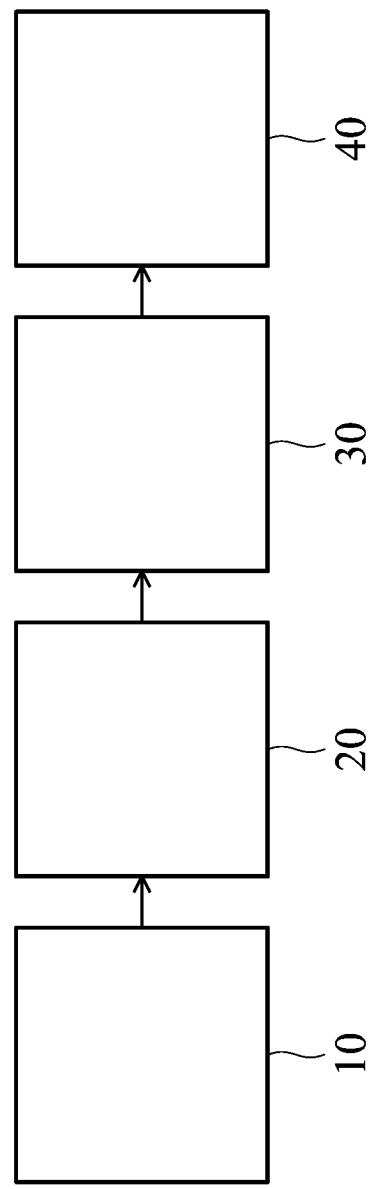
FIG. 3 shows a block diagram of the removal process for removing the photoresist layer, in accordance with some embodiments of the disclosure.

After the patterning process, the photoresist layer is removed by a removal step. The removal step includes four steps. FIG. 3 shows a block diagram of the removal process for removing the photoresist layer, in accordance with some embodiments of the disclosure. The MEMS device structure 100 is put in a first cleaning solution 10, a second cleaning solution 20, a third cleaning solution 30 and a spin-dryer 40 in sequence.

It should be noted that the removal process includes four steps. In the first step, a first cleaning step is performed on the MEMS device structure 100 using a first cleaning solution 10. The first cleaning solution 10 is capable of removing residual organic photoresist material. In some embodiments, the first cleaning solution 10 is made of amine-based solution. In some embodiments, EKC270, manufactured by EKC Technology, Inc. of Danville, Calif. is used as the first cleaning solution 10. In some other embodiments, the first cleaning solution 10 is made of fatty alcohol solution. In some embodiments, AP841 is used as the first cleaning solution 10.

Next, a second cleaning step is performed on the MEMS device structure 100 using a second cleaning solution 20. The second cleaning solution 10 is a buffer solution and is used to remove the first cleaning solution 10. In some embodiments, the second cleaning solution 10 is N-methylpyrrolidone (NMP). The polarity of the second cleaning solution 20 is close to that of the first cleaning solution 10, and therefore the second cleaning solution 20 may be completely removed by the first cleaning solution. In some embodiments, the contact angle between the first cleaning solution 10 and the second cleaning solution 20 is in a range from about 60 degrees to about 80 degrees. In some embodiments, the first cleaning solution 10 is AP841 and the second cleaning solution 20 is NMP, and a contact angle between the first cleaning solution 10 and the second cleaning solution 20 is about 80 degrees.

Afterwards, a third cleaning step is performed on the MEMS device structure 100 using water to rinse the MEMS device structure 100. Water is used to completely remove the first cleaning solution 10 and the second cleaning solution 20.

Finally, a spin drying step is performed using a spin-dryer 40 to remove all solvents used in the previous steps. It should be noted that the spin drying step is a dry step to prevent any wet solvents from leaking into the cavity 202 and/or the channel 204 the MEMS device structure 100. If the solvent flows into the cavity 202 and/or the channel 204, the performance of the MEMS device structure 100 may be degraded.

Figure 1O:
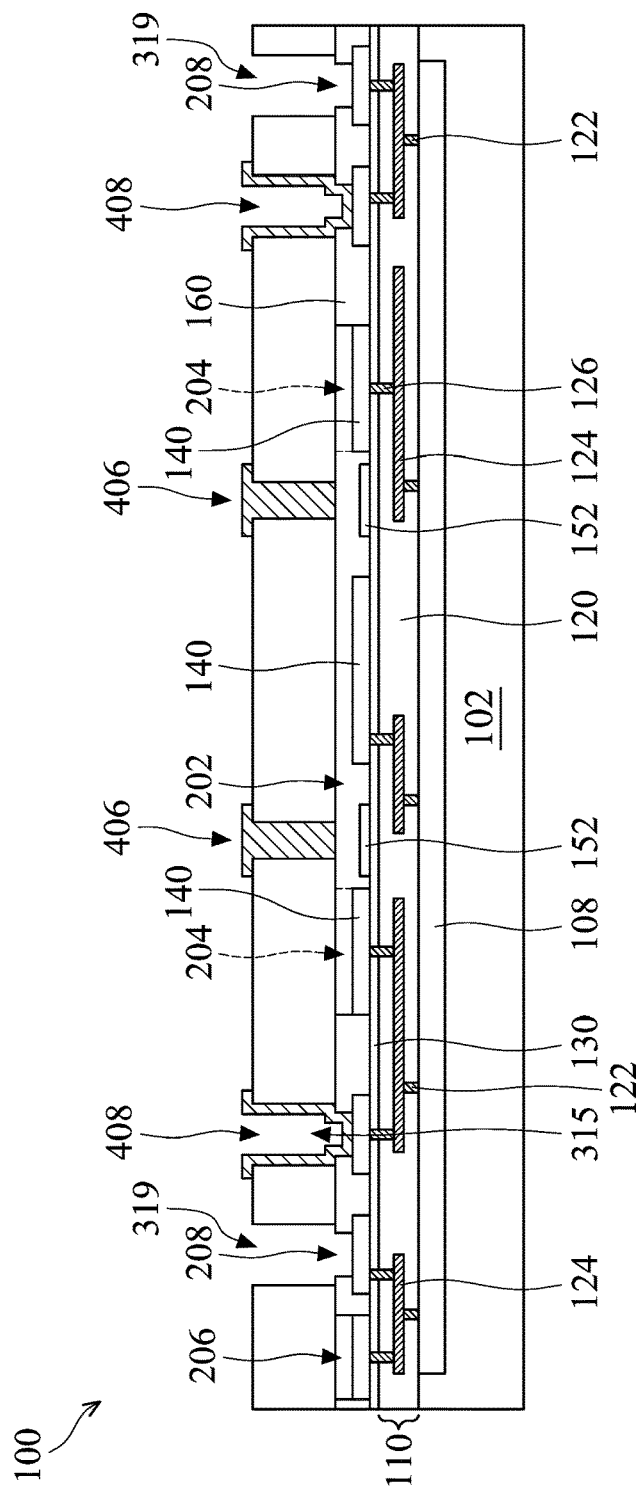

Afterwards, as shown in FIG. 1O, a portion of the second substrate 302 is removed to form a third hole 319, in accordance with some embodiments of the disclosure. In some embodiments, the portion of the second substrate 302 is removed by an etching process, such as a dry etching process or a wet etching process.

Figure 1P:
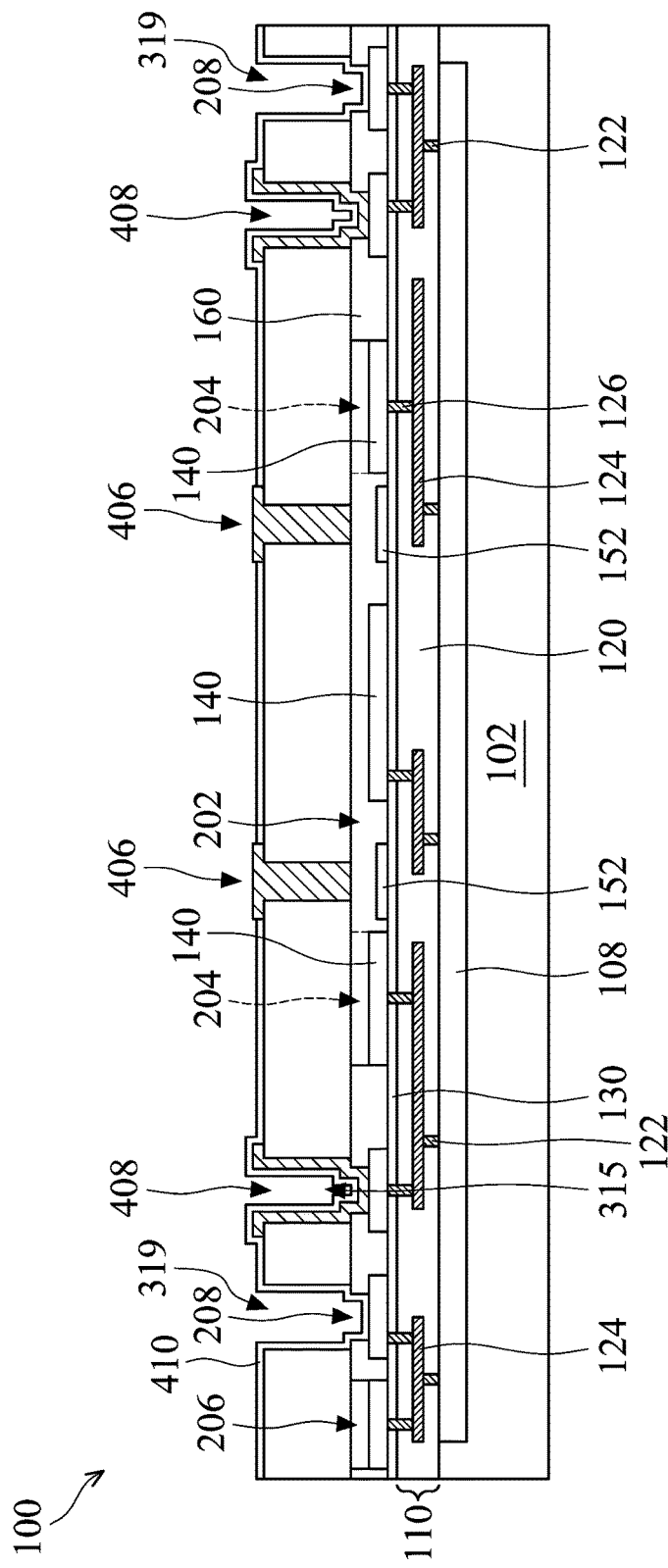
Figure 1Q:
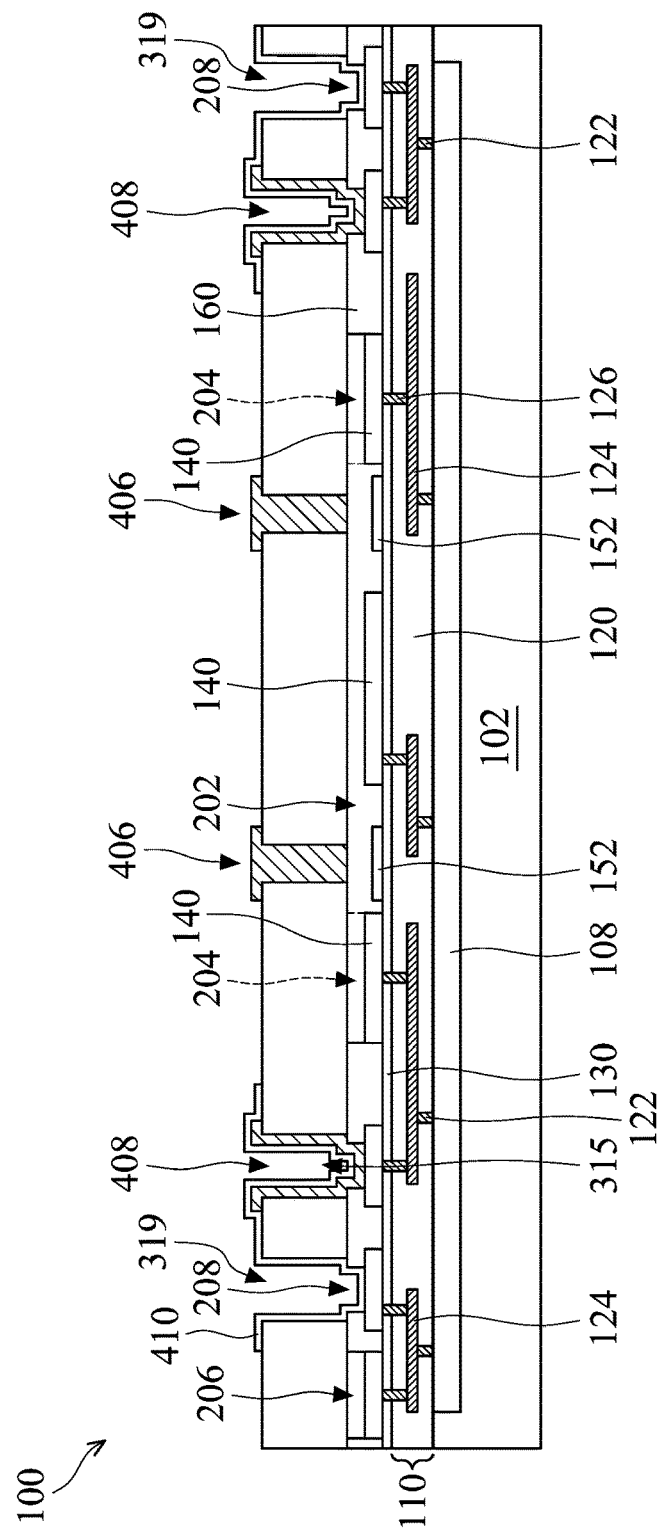

Next, as shown in FIG. 1P, a passivation layer 410 is formed on the first plug 406, the second plug 408, the remaining second substrate 302 and the third hole 319, in accordance with some embodiments of the disclosure. The passivation layer 410 is used to prevent gases and moisture from diffusing from the environment to the cavity 202 and/or the channel 204.

Next, as shown in FIG. 1Q, a portion of the passivation layer 410 is removed, in accordance with some embodiments of the disclosure. The portion of the passivation layer 410 is removed by a patterning process. The patterning process includes a photolithography process and an etching process.

After the patterning process, the photoresist layer (not shown) is removed by a removal step. The removal step includes four steps, for example, shown in FIG. 3. The removal step includes performing a first cleaning step, performing a second cleaning step, performing a third cleaning step and performing a spin drying step. The remaining photoresist layer is removed completely by above four steps to prevent the solvents from leaking into the cavity 202 and/or the channel 204.

In some embodiments, the MEMS device structure 100 is a pressure sensor which includes a flexible membrane arranged over a cavity hermetically sealed with a reference pressure. Assuming the reference pressure is steady, the flexible membrane deflects in proportion to the difference between the environmental pressure and the reference pressure.

Embodiments for forming a micro-electro-mechanical system (MEMS) device structure are provided. A second substrate is formed over a first substrate, and a cavity is formed between the first substrate and the second substrate. The second substrate is etched to by an etching process to form a hole through the second substrate, and the hole is connected to the cavity. The etching process includes a plurality of etching cycles, and each of the etching cycles includes an etching step, the etching step has a first stage and a second stage. The etching time of each of the etching steps during the second stage is gradually increased as the number of etching cycles is increased. The etching quality of the etching step 15 is improved by using a two-stage etching operation. The unwanted by-products are removed completely by the two-stage etching operation. Therefore, the performance of the MEMS device structure is improved.

Furthermore, during fabrication of the MEMS device structure, the photoresist layer is removed by a removal step. The removal step includes four steps. The final step does not include a wet cleaning process, and therefore the solvents in the removal step are completely removed. Therefore, the solvent does not flow into the cavity and/or the channel inside of the MEMS device structure.

In some embodiments, a method for forming a micro-electro-mechanical system (MEMS) device structure is provided. The method includes forming a second substrate over a first substrate, and a cavity is formed between the first substrate and the second substrate. The method includes forming a hole through the second substrate using an etching process, and the hole is connected to the cavity. The etching process includes a plurality of etching cycles, and each of the etching cycles includes an etching step, the etching step has a first stage and a second stage. The etching time of each of the etching steps during the second stage is gradually increased as the number of etching cycles is increased.

In some embodiments, a method for forming a micro-electro-mechanical system (MEMS) device structure is provided. The method includes forming an electrode over a substrate and forming a cavity over the electrode. The method also includes forming a MEMS substrate over the substrate, and the cavity is formed between the first substrate and the MEMS substrate. The method further includes performing a dry etching process on the MEMS substrate to form a hole in the MEMS substrate, and the dry etching process includes a plurality of etching cycles. Each of the etching cycles includes performing a deposition step to form a protection layer on the opening, performing a stripping step to remove a portion of the protection layer, and performing an etching step to etch a portion of the MEMS substrate.

In some embodiments, a method for forming a micro-electro-mechanical system (MEMS) device structure is provided. The method includes forming an electrode over a first substrate and forming a cavity adjacent to the electrode. The method also includes forming a MEMS substrate over the electrode, and the cavity is surrounded by the first substrate and the MEMS substrate. The method further includes forming a hole through the MEMS substrate by a dry etching process and performing a cleaning process on the hole after the dry etching process. The cleaning process does not comprise a wet cleaning process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a micro-electro-mechanical system (MEMS) device structure, comprising:
    forming a second substrate over a first substrate, wherein a cavity is formed between the first substrate and the second substrate;
    forming a hole through the second substrate using an etching process, wherein the hole is connected to the cavity, and
    the etching process comprises a plurality of etching cycles, and each of the etching cycles comprises an etching step, the etching step has a first stage and a second stage, wherein an etching time of each of the etching steps during the second stage is gradually increased as the number of etching cycles is increased.

2. The method for forming the micro-electro-mechanical system (MEMS) device structure as claimed in claim 1, wherein the etching time of each of the etching steps during the first stage is a constant value.

3. The method for forming the micro-electro-mechanical system (MEMS) device structure as claimed in claim 1, wherein the hole has a final depth after the etching cycles, and the etching process is changed from the first stage to the second stage when an intermediate depth of the hole is in a range from about 70% to about 80% of the final depth.

4. The method for forming the micro-electro-mechanical system (MEMS) device structure as claimed in claim 1, wherein each of the etching cycles further comprises:
    performing a deposition step; and
    performing a stripping step after the deposition step, wherein the etching step is performed after the stripping step.

5. The method for forming the micro-electro-mechanical system (MEMS) device structure as claimed in claim 4, wherein performing the deposition step comprises using a fluorocarbon gas comprising $C_4F_8$, $CF_4$, $CHF_3$, $CH_2F_2$ or a combination thereof.

6. The method for forming the micro-electro-mechanical system (MEMS) device structure as claimed in claim 1, further comprising:
performing a cleaning process on the hole after the etching process, wherein the cleaning process is performed using an oxygen ($O_2$) plasma.

7. The method for forming the micro-electro-mechanical system (MEMS) device structure as claimed in claim 6, wherein the cleaning process does not comprise a wet cleaning process.

8. The method for forming the micro-electro-mechanical system (MEMS) device structure as claimed in claim 6, wherein the cleaning process and the etching process are performed in the same chamber.

9. The method for forming the micro-electro-mechanical system (MEMS) device structure as claimed in claim 1, further comprising:
filling a metal layer into the hole;
patterning the metal layer using a patterned photoresist layer as a mask; and
removing the patterned photoresist layer by performing a removal process, wherein the removal process comprises:
performing a first cleaning step using a first cleaning solution;
performing a second cleaning step using a second cleaning solution, wherein a contact angle between the second cleaning solution and the first cleaning solution is in a range from about 80 degrees to about 90 degrees.

10. The method for forming the micro-electro-mechanical system (MEMS) device structure as claimed in claim 9, wherein the removal process further comprises a spin drying step after the second cleaning step.

11. The method for forming the micro-electro-mechanical system (MEMS) device structure as claimed in claim 9, further comprising:
performing an exhaust process to exhaust air inside of the hole before the step of filling the metal layer into the hole.

12. The method for forming the micro-electro-mechanical system (MEMS) device structure as claimed in claim 1, wherein forming the second substrate over the first substrate comprises bonding the second substrate to the first substrate by performing a fusion bonding process.

13. A method for forming a micro-electro-mechanical system (MEMS) device structure, comprising:
forming an electrode over a substrate;
forming a cavity over the electrode;
forming a MEMS substrate over the substrate, wherein the cavity is formed between the first substrate and the MEMS substrate; and
performing a dry etching process on the MEMS substrate to form a hole in the MEMS substrate, wherein the dry etching process comprises a plurality of etching cycles, each of the etching cycles comprising:
performing a deposition step to form a protection layer on the opening;
performing a stripping step to remove a portion of the protection layer; and
performing an etching step to etch a portion of the MEMS substrate.

14. The method for forming the micro-electro-mechanical system (MEMS) device structure as claimed in claim 13, further comprising:
performing a cleaning process on the hole after the dry etching process, wherein the cleaning process is performed using an oxygen ($O_2$) plasma.

15. The method for forming the micro-electro-mechanical system (MEMS) device structure as claimed in claim 13, wherein the etching step has a first stage and a second stage, wherein the etching time of each of the etching steps during the first stage is a constant value as the number of etching cycles is increased, and the etching time of each of the etching steps during the second stage is gradually increased as the number of etching cycles is increased.

16. The method for forming the micro-electro-mechanical system (MEMS) device structure as claimed in claim 13, wherein each of the etching steps during the first stage has an etching gas with a flow rate that is a constant value as the number of etching cycles is increased, and each of the etching steps during the second stage has an etching gas with a flow rate that is gradually increased as the number of etching cycles is increased.

17. The method for forming the micro-electro-mechanical system (MEMS) device structure as claimed in claim 13, further comprising:
filling a metal layer into the hole;
patterning the metal layer using a patterned photoresist layer as a mask; and
removing the patterned photoresist layer using a cleaning process, wherein the cleaning process comprises a spin drying step.

18. A method for forming a micro-electro-mechanical system (MEMS) device structure, comprising:
forming an interconnect structure over a first substrate;
forming an outgassing prevention layer over the interconnect structure;
forming a cavity adjacent to the outgassing prevention layer;
forming a MEMS substrate over the electrode, wherein the cavity is surrounded by the first substrate and the MEMS substrate;
forming a hole through the MEMS substrate using a dry etching process; and
performing a cleaning process on the hole after the dry etching process, wherein the cleaning process does not comprise a wet cleaning process.

19. The method for forming the micro-electro-mechanical system (MEMS) device structure as claimed in claim 18, further comprising:
filling a metal layer into the hole;
patterning the metal layer using a patterned photoresist layer as a mask; and
removing the patterned photoresist layer by performing a removal process, wherein the removal process comprises a spin drying step.

20. The method for forming the micro-electro-mechanical system (MEMS) device structure as claimed in claim 19, wherein performing the removal process further comprises:
performing a first cleaning step using a first cleaning solution; and
performing a second cleaning step using a second cleaning solution, wherein a contact angle between the second cleaning solution and the first cleaning solution is in a range from about 80 degrees to about 90 degrees.

* * * * *